United States Patent [19]
Halbert et al.

[11] Patent Number: 5,623,232
[45] Date of Patent: Apr. 22, 1997

[54] TOPOGRAPHY FOR INTEGRATED CIRCUIT OPERATIONAL AMPLIFIER HAVING LOW IMPEDANCE INPUT FOR CURRENT FEEDBACK

[75] Inventors: Joel M. Halbert; Kenneth W. Murray; Dan Yuan, all of Tucson, Ariz.

[73] Assignee: Burr-Brown Corporation, Tucson, Ariz.

[21] Appl. No.: 534,046

[22] Filed: Sep. 26, 1995

[51] Int. Cl.⁶ ............................... H03F 1/30; H03F 3/213
[52] U.S. Cl. ........................... 330/307; 330/266; 330/289
[58] Field of Search ...................................... 330/256, 266, 330/272, 289, 307

[56]  References Cited

U.S. PATENT DOCUMENTS

| | | | |
|---|---|---|---|
| 3,383,614 | 5/1968 | Emmons et al. | 330/307 X |
| 3,729,660 | 4/1973 | Maidque | 330/256 X |

*Primary Examiner*—James B. Mullins
*Attorney, Agent, or Firm*—Cahill, Sutton & Thomas P.L.C.

[57]  ABSTRACT

A high speed integrated circuit operational amplifier chip first, second, third and fourth successive edges includes a thermal centerline parallel to the second and fourth edges. An output driver circuit is located adjacent to an output bonding pad along the third edge and is disposed approximately symmetrically about the thermal centerline to provide approximately balanced differential heating of the operational amplifier chip relative to the thermal centerline. A differential input circuit is located adjacent to the first edge and is disposed approximately symmetrically about the thermal centerline to provide approximately balanced responses of matched transistors in the low gain differential input circuit to isotherms produced by the differential heating. The most thermally sensitive transistors are disposed along or symmetrically about the thermal centerline to provide approximately balanced response by such transistors to differential heating by the output driver circuit. The bonding pads, which function as heat sinks, also are symmetrically disposed on or about the thermal centerline.

6 Claims, 3 Drawing Sheets

TOPOGRAPHY FOR INTEGRATED CIRCUIT OPERATIONAL AMPLIFIER HAVING LOW IMPEDANCE INPUT FOR CURRENT FEEDBACK

BACKGROUND OF THE INVENTION

The invention relates to an integrated circuit topography for a high speed operational amplifier having a low input impedance to facilitate use of current feedback.

By way of background regarding topography of integrated circuit chips, the size of an integrated circuit chip is an important factor in the ultimate cost to the final user. Another important factor is the engineering and design cost. Increasing the number of chips which are included on each wafer reduces the manufacturing cost per chip because the cost of each wafer is approximately constant. The chip size becomes an increasingly dominant factor in the ultimate product cost as the manufacturing volume increases. On each chip there are many conductive lines, some composed of aluminum or other metalization, on one or more insulative layers. Other conductors are composed of diffused regions within the silicon material of the chip. For some processes, polycrystalline silicon layers form some of the conductors. The various conductors interconnect the various electrodes of various circuit elements such as lateral PNP transistors, vertical NPN and PNP transistors, diffused resistors, thin film resistors, and metal capacitors all of which are formed using conventional bipolar manufacturing wafer fabrication processes. Specified line widths and spacings between the respective conductors and circuits element parts on each insulative layer must be maintained to avoid short circuits therebetween and to limit various parasitic effects. There often are variations in the manufacturing process parameters due to machine calibration errors and minute particulates that are invariably present in a semiconductor processing facility, and the presence of such variations dictates that the specified widths and spacings be adhered to. Furthermore, the conductor lengths, and hence their associated capacitances and resistances, must be minimized not only to reduce chip size, but also to achieve maximum circuit operating speed.

Those skilled in the art of integrated circuit chip design know that there are a number of design tradeoffs, including the desirability of minimizing chip size, obtaining suitable chip aspect ratios, increasing circuit operating speed, reducing power consumption, and avoiding various undesirable thermal effects. Such thermal effects can be due to localized DC and transient power dissipation by various transistors on the chip and also due to the sensitivity of other transistors on the chip to such thermal effects. More specifically, some of the numerous design constraints faced by the chip designer include specifications for minimum widths and spacings of diffused regions in the silicon, the minimum sizes required for contact openings between the insulating field oxide, the spacings required between edges of contact openings to edges of diffused regions, minimum widths and spacings of metal conductors, the availability or nonavailability of multiple metalization layers and conductive vias interconnecting the various layers, and the constraint that conductors on the same "layer" of the chip cannot cross one another. The large amount of capacitance associated with diffused regions must be carefully considered by the circuit designer and the chip designer in arriving at an optimum chip topography. The practically infinite number of possibilities for routing the various conductors and placement of the various transistors, resistors and capacitors on an integrated circuit taxes the skill and ingenuity of even the most resourceful chip designers and circuit designers and is beyond the capability of the most sophisticated computer layout programs yet available. Other constraints faced by the chip designer and the circuit designer involve the need to minimize cross-coupling and parasitic effects which occur between various conductive lines and conductive regions. Such effects may degrade voltages on various conductors, leading to inoperative circuitry, reduced performance or low reliability operation under certain operating conditions.

Often, the technical and commercial success of an integrated circuit chip may hinge on the ability of the "chip designer" or "layout designer" to achieve an optimum circuit topography, and often that topography is only obtained as a result of a great deal of interaction between the circuit designers and the layout designers and careful balancing of the above tradeoffs.

Thus, those skilled in the art know that a very high level of creative interaction between the circuit designer and the chip designer or layout draftsman may be required to achieve a chip topography or layout that enables the integrated circuit to have acceptably high operating speed, acceptably low power dissipation, acceptable immunity from differential or transient thermal conditions in the chip, and yet is sufficiently small in size to be economically advantageous.

By way of background regarding good thermal design of an integrated circuit, thermal design of a bipolar integrated circuit chip requires careful consideration of the locations of transistors that when operated produce significant "differential heating" of localized regions of the chip. Good thermal design of the chip also requires careful consideration of the locations of transistors the operation of which are significantly affected by such differential heating. Good thermal design of a chip generally involves determination of the location of a "thermal centroid" of a transistor or group of transistors which produce significant differential heating effects, and then locating such transistor or group of transistors so that its thermal centroid lies on a preestablished "thermal centerline" of the chip. Similarly, thermal centroids of heat sensitive transistors, herein called "heat receptors", or groups of such heat receptor transistors should be located on the thermal centerline of the chip, or should be located as far away as possible from the source of significant differential heating effects. Failure to provide good thermal design of a chip may result in reliability problems, offset problems, linearity problems, and/or otherwise unacceptable circuit performance as a result of unbalanced differential heating of transistors which are in the main signal path or in critical bias circuits.

These considerations, in addition to the requirements mentioned above, add considerably to the challenge of providing an overall chip topography which is optimum from the various viewpoints of reliable, high speed, low power operation. In general, transistors which carry low level signals should be located symmetrically with respect to the thermal centerline of the chip so that they are equally affected by transient thermal effects produced by other transistors on the chip, which also should be located symmetrically with respect to the thermal centerline. Generally, a transistor that has a substantial collector voltage swing has a possibility of being a substantial differential heat generator, and its location must be carefully considered with respect to any transistors in the signal path which might be affected by transient temperature changes of its emitter-base junction.

For these reasons, it is typical in operational amplifier integrated chip layouts to avoid some of the possible differential thermal effects from increasing the amplifier input offset, affecting the open loop gain, and affecting the amplifier linearity by establishing a thermal centerline of the chip and locating differential heat generating transistors on the thermal centerline. It also is conventional to split "heat receptor" transistors into two equal, parallel-connected parts and place such parts symmetrically on opposite sides of the thermal centerline.

SUMMARY OF THE INVENTION

Accordingly, it is an object of the invention to provide an integrated circuit chip topography for a high speed amplifier with a low impedance input to allow use of current feedback, and more particularly to such a topography which occupies a minimum amount of chip area and avoids performance degradation due to unbalanced internal thermal responses of thermally sensitive transistors to internal heat generation.

Briefly described, and in accordance with one embodiment thereof, the invention provides a high speed integrated circuit operational amplifier chip (60) including first (60L), second (60B), third (60R) and fourth (60T) successive edges. The operational amplifier chip includes a plurality of bonding pads, including an inverting input bonding pad (62B) located in a first corner formed by the first (60L) and fourth (60T) edges, a non-inverting input bonding pad (62A) located in a second corner formed by the first (60L) and second (60B) edges, a $V_{EE}$ bonding pad located in a third corner formed by the second (60B) and third (60R) edges, a $V_{CC}$ bonding pad located in a fourth corner formed by the third (60L) and fourth (60T) edges, and an output bonding pad located along the third edge (60R) between the $V_{EE}$ and $V_{CC}$ bonding pads. A thermal centerline (44) parallel to the second and fourth edges divides the chip into approximately equal sections. An output driver circuit (68) is located adjacent to the output bonding pads and is disposed approximately symmetrically about the thermal centerline (44) to provide approximately balanced differential heating of the operational amplifier chip relative to the thermal centerline. A low gain differential input circuit (66) is located adjacent to the first edge (60L) and is disposed approximately symmetrically about the thermal centerline to provide approximately balanced responses of matched transistors in the low gain differential input circuit to isotherms produced by the differential heating. PNP current mirror transistors (5, 6, 7) are located in a first area (67) adjacent to the low gain differential input circuit (66) and are symmetrically disposed about the thermal centerline (44). NPN current mirror transistors (8, 9, 10) are located in a second area (63) adjacent to the first area (67) and are symmetrically disposed about the thermal centerline. This arrangement provides approximately balanced responses of the matched current mirror transistor pairs to differential heating by the output driver circuit (68), and locates the NPN current mirror cascode transistor (10) and the PNP current mirror cascode transistor (7) on the thermal centerline (44).

DETAILED DESCRIPTION OF THE PREFERRED EMBODIMENTS

Figure 1:
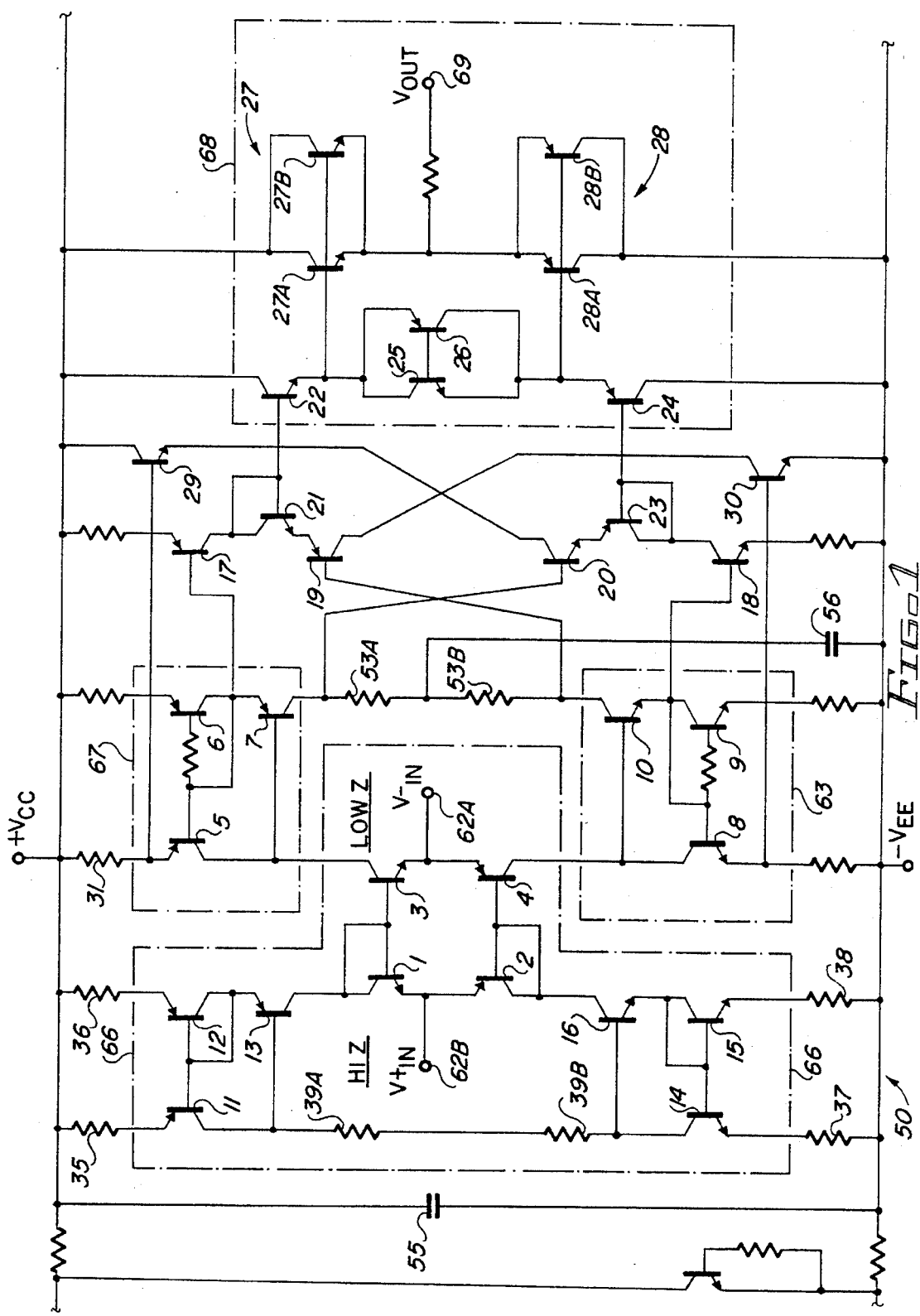
FIG. 1 is a schematic diagram of a presently preferred embodiment of the present invention.

Before describing the topography of the present invention, which is embodied in the circuit of FIG. 1 (which is a simplified schematic diagram of the Burr-Brown OPA658 operational amplifier, recently introduced to the market), it will be helpful to describe the circuit structure and operation of the operational amplifier with reference to FIG. 1. Referring to FIG. 1, high speed operational amplifier 50 includes an input stage 66 that includes NPN input transistors 1 and 3 with their emitters connected to $V_{IN}^+$ bonding pad or terminal 62B and $V_{IN}^-$ bonding pad or terminal 62A, respectively. PNP input transistors 2 and 4 have their emitters connected to bonding pads or terminals 62B and 62A, respectively. The base and collector of transistor 1 are connected to the base of transistor 3 and to the collector of PNP current mirror cascode transistor 13, the emitter of which is connected to the collector and base of PNP current mirror control transistor 12. The emitter of transistor 12 is coupled by resistor 36 to $+V_{CC}$. The base of PNP cascode transistor 13 is connected to the collector of PNP current mirror transistor 11, the base of which is connected to the base of transistor 12. The emitter of transistor 11 is coupled by resistor 35 to $+V_{CC}$.

The collector of transistor 11 is connected in series with resistors 39A and 39B and the collector NPN current mirror transistor 14, the emitter of which is coupled by resistor 37 to $-V_{EE}$. The base of transistor 14 is connected to the base and collector of NPN current mirror control transistor 15, the emitter of which is coupled by resistor 38 to $-V_{EE}$. The collector and base of transistor 15 are connected to the emitter of NPN cascode transistor 16, the base of which is connected to the collector of transistor 14. The collector of transistor 16 is connected to the collector and base of input transistor 2. As subsequently explained, the above mentioned transistors are located in an area of integrated circuit chip 60 which also is designated by numeral 66 in FIGS. 2 and 3.

The collector of NPN input transistor 3 is connected to the collector of PNP current mirror output transistor 5, the emitter of which is coupled by resistor 31 to $+V_{CC}$. The base of transistor 5 is coupled to the base and collector of PNP current mirror control transistor 6, the emitter of which is coupled by a resistor to $+V_{CC}$. The collector of transistor 6 is coupled to the emitter of PNP current mirror cascode transistor 7, the base of which is connected to the collector of transistor 5. The collector of transistor 6 also is connected to the base of PNP transistor 17, the emitter of which is coupled by a resistor to $V_{CC}$. The collector of transistor 17 is connected to the base and collector of NPN level shift transistor 21 of a diamond follower output circuit including transistors 17, 19, 20, 23, 18, 30, 22, 25, 26, 24, 27 and 28. The emitter of level shift transistor 21 is connected to the emitter of diamond follower PNP input transistor 19. The collector of transistor 19 is connected to the emitter of PNP transistor 30, the base of which is connected to the emitter of NPN current mirror output transistor 8. The collector of transistor 30 is connected to $-V_{EE}$.

Diamond follower NPN input transistor 20 has a collector connected to the emitter of NPN transistor 29, the collector of which is connected to $+V_{CC}$ and the base of which is connected to the emitter of transistor 5. The emitter of diamond follower input transistor 20 is connected to the emitter of PNP level shift transistor 23, the base and collector of which are connected to the base of PNP transistor 24 and to the collector of NPN transistor 18. The emitter of transistor 18 is connected by a resistor to $-V_{EE}$.

The collector of input transistor 4 is connected to the base of NPN current mirror cascode transistor 10 and to the collector of NPN current mirror output transistor 8, the emitter of which is connected by a resistor to $-V_{EE}$. The base of transistor 8 is coupled to the collector and base of NPN transistor 9, the emitter of which is connected by a resistor to $-V_{EE}$. The base of transistor 8 is connected to the base of transistor 18.

The collector of transistor 10 is coupled to the collector of transistor 7 by a pair of low value resistors 53A and 53B, across which an approximately constant 200 millivolt voltage drop is maintained by the currents in transistors 7 and 10. The collector of transistor 7 is connected to the base of diamond follower input transistor 20, and the collector of transistor 10 is connected to the base of diamond follower input transistor 19.

Figure 2:
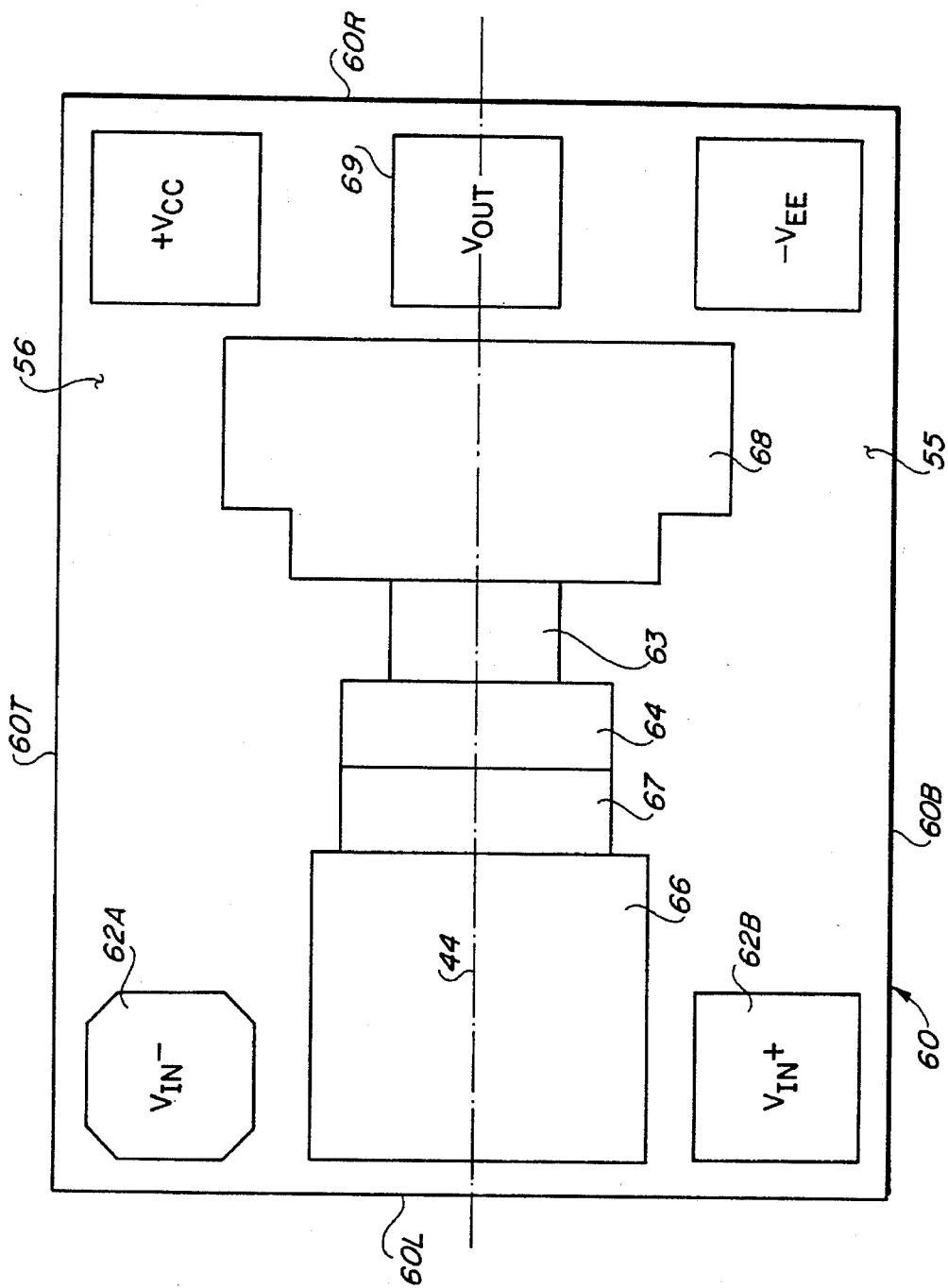
FIG. 2 is a scale diagram generally outlining the locations of the main sections of the circuit of FIG. 1 on the surface of an integrated circuit chip.
Figure 3:
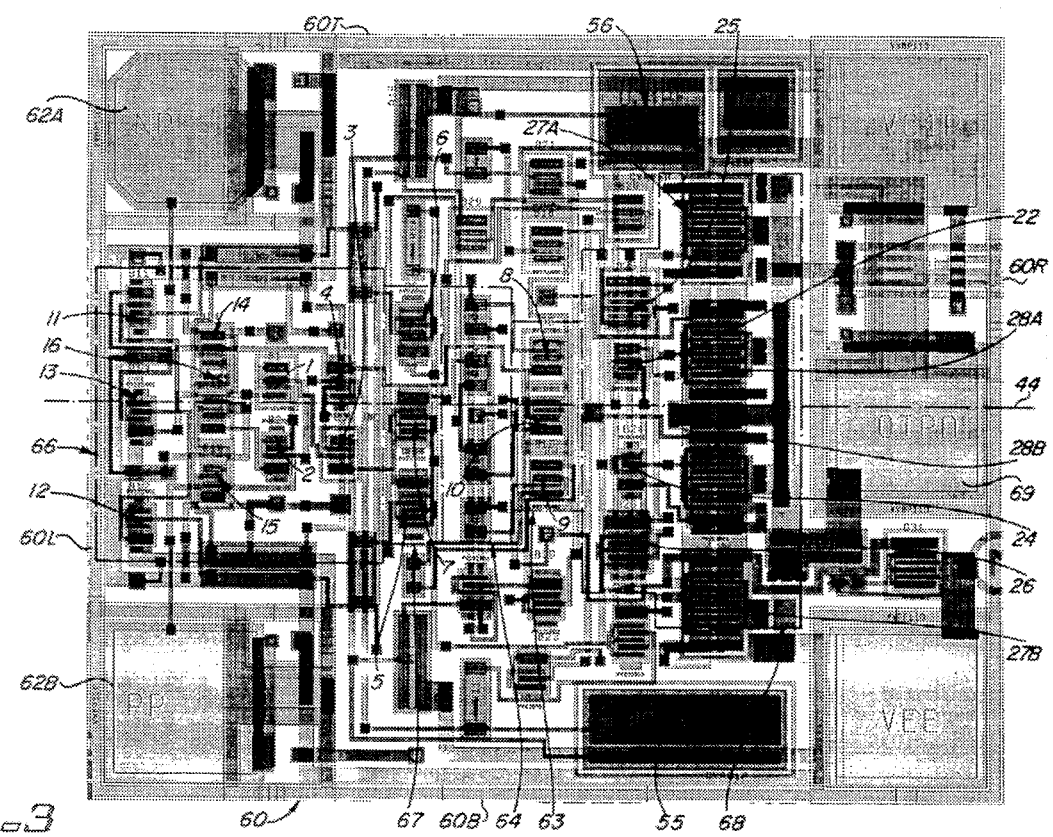
FIG. 3 is a scale diagram showing the section of FIG. 2 superimposed on a "composite" printout of several of the mask layers utilized in fabricating the integrated circuit operational amplifier of FIG. 1.

PNP current mirror transistors 5 and 6 and PNP cascode current mirror transistor 7 and disposed in area 67 of chip 60 as indicated in FIGS. 2 and 3. Similarly, NPN current mirrors 8 and 9 and their cascode transistor 10 are formed in area 63 of chip 60.

NPN output driver bias transistor 22 has its collector connected to $+V_{CC}$, its base connected to the base of transistor 21, and its emitter connected to the collector of NPN transistor 25, the emitter of PNP transistor 26, and the base of NPN output transistor 27, which is "split" into identical parallel-connected sections 27A and 27B, the collectors of which are connected to $+V_{CC}$. The emitters of NPN output transistor sections 27A and 27B are coupled by a low value resistor to the $V_{OUT}$ bonding pad or terminal 69.

PNP output drive bias transistor 24 has its collector connected to $-V_{EE}$, its base connected to the base of transistor 23, and its emitter connected to the emitter of NPN transistor 25 and the collector of PNP transistor 26, the bases of which are connected together. The emitter of transistor 24 also is connected to the base of PNP output transistor 28, which is "split" into identical parallel-connected sections 28A and 28B, the emitters of which are coupled by the above mentioned low value resistor to $V_{OUT}$ terminal 69 and the collectors of which are connected to $-V_{EE}$. Transistors 22, 24, 25, 26, 27, and 28 are included in area 68 in FIGS. 2 and 3.

Referring to FIGS. 2 and 3, the diagrams of which are drawn to scale, high speed operational amplifier chip 60 includes left, right, top, and bottom edges 60L, 60R, 60T, and 60B, respectively. A horizontal thermal centerline 44 is preestablished so as to bisect the chip 60 into approximately equal half sections. $V_{IN}^-$ bonding pad 62A is located in the upper left corner of chip 60 as it appears in FIG. 2. The $V_{IN}^+$ bonding pad 62B is located in the lower left corner of chip 60. The $+V_{CC}$ bonding pad is located in the upper right corner, and the $-V_{EE}$ bonding pad is located in the lower right corner. $V_{OUT}$ bonding pad 69 is located midway between the $+V_{CC}$ and $-V_{EE}$ bonding pads adjacent to right edge 60R. The sequence of bonding pad locations and their sizes, which are drawn to scale in FIG. 2, are determined primarily by standardized lead locations for $V_{IN}^-$, $V_{IN}^+$, $+V_{CC}$, $V_{OUT}$, and $-V_{EE}$ lead locations for standard operational amplifiers. The locations of the remaining circuit elements are confined to the remaining area of the chip.

The five bonding pads are located symmetrically with respect to thermal centerline 44 because they and their respective bonding wires, which are connected to corresponding package leads, constitute significant heat sinks for chip 60. Consequently, the symmetrical bonding pad locations improve the symmetry of the isotherms produced in chip 60.

As indicated in FIG. 3, reference numeral 66 indicates the area in which transistors 1, 2, 3, 4, 11, 12, 13, 14, 15, and 16 are located. Transistor 7 is positioned on thermal centerline 44 and transistors 5 and 6 are symmetrically positioned about thermal centerline 44 within area 67. Similarly, transistor 10 is positioned on thermal centerline 44 and transistors 8 and 9 are symmetrically positioned about thermal centerline 44 in area 63.

NPN output transistor sections 27A and 27B are located symmetrically about thermal centerline 44, i.e., aligned along a line perpendicular to thermal centerline 44, within area 68. Similarly, PNP output transistor sections 28A and 28B are aligned symmetrically along the same perpendicular line mentioned above, below thermal centerline 44, and within area 68. PNP transistor 26 and NPN transistor 25 are located in area 68, aligned along a line perpendicular to thermal centerline 44, and disposed equidistant below and above it. NPN transistor 22 and PNP transistor 24 similarly are located in area 68, perpendicularly aligned and disposed equidistant above and below thermal centerline 44.

The transistors located in areas 66, 67, and 63 in FIGS. 2 and 3 include NPN input transistors 1 and 3 and PNP input transistors 2 and 4 which form low-gain circuity in the signal path; these are the transistors which are among the most significantly affected by unbalanced differential heating in the chip. The transistors located in area 68 in FIG. 2 are the transistors which during operation produce the most significant and substantial differential heating, and are located so as to produce symmetrical isotherms.

The above mentioned considerations for good thermal design necessitated finding an arrangement consistent with the circuit diagram of FIG. 1 which would also achieve good thermal design. The arrangement of FIGS. 2 and 3 accomplishes that with respect to areas 66, 67 and 63, and leaves the rest of the chip surface area for placement of the other circuit components of high speed operational amplifier 50 of FIG. 1. Compensation capacitors 55 and 56 of FIG. 1 are located in the areas pointed to by the lead lines from numerals 55 and 56 between edges 60B and 60T and area 68 in FIGS. 2 and 3.

For the layout of FIGS. 2 and 3, the sizes of and minimum spacings between input bonding pads 62A and 62B, output bonding pad 69, and the $+V_{CC}$ and $-V_{EE}$ bonding pads and the placement of such bonding pads within "allowed sectors", and also the fact that integrated circuit operational amplifiers have standard package lead locations, constituted an initial set of layout design constraints. These constraints led to the location of input stage 66 near left edge 60L and diamond follower output stage 68 close to the right edge 30R.

In FIG. 3 it can be seen that input transistors 1, 2, 3 and 4 are arranged into a "quad". The thermal centroid of such quad 1, 2, 3, 4 is positioned on thermal centerline 44, close to the left edge 60L. The "splitting" of the output stage PNP transistor 27 into transistor sections 27A and 27B, and also the splitting of NPN transistor 28 into transistor sections 28A and 28B, and positioning such corresponding transistor sections symmetrically about (i.e., equidistant from) thermal centerline 44 as indicated in FIGS. 2 and 3, is not conventional. A considerable amount of effort was required to arrive at these aspects of the illustrated chip topography or layout.

An important tradeoff in the design of the output stage including transistors 27A,B and 28A,B is whether the extra chip area required to symmetrically "split" these transistors and route the additional conductors necessary to accomplish such splitting and separating the split sections to the symmetrical opposed locations about thermal centerline 44 would be worth the benefits of avoiding differential heating effects on the temperature-sensitive transistors in the signal path, including input transistors 1, 2, 3 and 4, all of which propagate very low level analog signals representative of the applied differential input voltage.

Diamond follower input transistors 19 and 20 undergo large collector voltage swings, and therefore can act as differential heat generators. They are located as symmetrically as practical about thermal centerline 44. Current source transistors 17 and 18, which supply current to diamond follower input transistors 19 and 20, undergo large collector voltage swings, and therefore are significant differential heat generators. Current mirror cascode transistors 7 and 10 also undergo large collector voltage swings, and therefore are significant differential heat generators. This is also the case for emitter follower transistors 22 and 24. To the extent possible, each of these pairs of transistors are positioned so that the thermal centroid of that pair is located on thermal centerline 44.

The placement of the above indicated transistors in output stage 68 in the area designated also by numeral 68 in FIGS. 2 and 3 resulted in a large amount of available space in the upper and lower right hand corners of chip 60. This was convenient for location of the several large capacitors 55 and 56 of operational amplifier chip 60, because such capacitors, which consist of metal-oxide-silicon structures, are very insensitive to differential temperature variations.

The PNP and NPN current mirror cascode transistors 13 and 16 are located on thermal centerline 44 because these transistors are significant heat generators which produce isotherms that propagate throughout the chip. Current mirror transistor 11 and NPN current mirror transistor 14 are located near the $V_{IN}^-$ pad 62A. Transistor 13 is placed between PNP current mirror control transistor 12 and PNP transistor 11 so transistor 13 can heat transistors 11 and 12 approximately the same amount. Similar considerations apply to placement of transistor 16, so that transistors 11 and 12 are approximately equidistant from both heat generating transistors 13 and 16. Similarly, transistors 14 and 15 are positioned approximately equidistant from transistors 13 and 16, as NPN current mirror transistors 13 and 16 need to be closely matched irrespective of thermal variations in chip 60.

Input transistors 1, 2, 3, and 4 are positioned as shown to have their thermal centroid on thermal centerline 44. However, conductor routing considerations necessitate the somewhat "non-symmetrical" positioning of transistor 2 to "beneath" (as it appears in FIG. 3) transistor 1 rather than "beside" it. All of input transistors 1, 2, 3, and 4 are positioned very close to thermal centerline 44, and therefore are nearly equally affected by symmetrical isotherms, especially those generated by the output transistors 27 and 28 in the output stage 68. Transistors 5, 6, and 7 which form a current mirror to bias the output stage, are symmetrically positioned in a "column" perpendicular to thermal centerline 44., with transistor 7 on thermal centerline 44 and with matching transistors 5 and 6 symmetrically spaced equidistant from thermal centerline 44 adjacent to and on either side of transistor 7. Similar considerations apply to the placement of NPN current mirror transistors 8 and 9 and current mirror cascode transistor 10 in area 63. Those sets of transistors also heat one another. That is, transistor 10 also heats transistors 5 and 6 symmetrically, and transistor 7 also heats transistors 8 and 9 symmetrically. Since they are on the thermal centerline, they also heat the input stage "quad" 1, 2, 3, 4 symmetrically, and they also heat current mirrors 11, 12 and 14, 15 symmetrically. The collectors of these transistors undergo large voltage changes, and therefore produce large isotherm variations that propagate through chip 60.

The placement of the remaining transistors in operational amplifier 50 of FIG. 1 was generally dictated by localized conductor routing considerations and presented no more than ordinary difficulty to the layout designer.

The above topography results in a chip size of 780 microns by 670 microns, with excellent high frequency performance, low offset voltage and current, and improved low frequency linearity and open loop transimpedance.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A high speed integrated circuit operational amplifier chip including first, second, third and fourth edges, the operational amplifier chip comprising in combination:

(a) a plurality of bonding pads, including an inverting input bonding pad located in a first corner formed by the first and fourth edges, a non-inverting input bonding pad located in a second corner formed by the first and second edges, a $V_{EE}$ bonding pad located in a third corner formed by the second and third edges, a $V_{CC}$ bonding pad located in a fourth corner formed by the third and fourth edges, and an output bonding pad located along the third edge between the $V_{EE}$ and $V_{CC}$ bonding pads;

approximately equal size first and second half sections of the operational amplifier chip being located on opposite sides of a thermal centerline parallel to the second and fourth edges;

(b) an output driver circuit located adjacent to the output bonding pad and disposed approximately symmetrically about the thermal centerline to provide approximately balanced differential heating of the operational amplifier chip relative to the thermal centerline, wherein the output driver circuit includes first and second parallel-connected NPN output transistor sections and first and second parallel-connected PNP output transistor sections, the first and second PNP output transistor sections being symmetrically disposed immediately adjacent to and on opposite sides of the thermal centerline, the first and second NPN output transistor sections being disposed symmetrically about the thermal centerline immediately adjacent to the first and second PNP output transistor sections, respectively, the first and second parallel-connected NPN output transistor sections and the first and second parallel-connected PNP output transistor sections being symmetrically aligned along a line perpendicular to the thermal centerline so as to both minimize the size of the chip and minimize thermal instability of the operational amplifier thereon;

(c) a low gain differential input circuit located adjacent to the first edge and disposed approximately symmetrically about the thermal centerline to provide approximately balanced responses of various matched transistors in the low gain differential input circuit to isotherms produced by the balanced differential heating; and (d) a plurality of transistors located adjacent to the low gain differential input circuit and disposed along the thermal centerline to provide approximately balanced response of the plurality of transistors to the balanced differential heating.

2. The high speed integrated circuit operational amplifier chip of claim 1 wherein the output driver circuit includes an NPN bias current transistor and a PNP bias current transistor symmetrically disposed adjacent to and on opposite sides of the thermal centerline and adjacent to the first and second PNP output transistor sections, respectively.

3. The high speed integrated circuit operational amplifier chip of claim 2 wherein the output driver circuit includes a PNP bias transistor and an NPN bias transistor disposed symmetrically about the thermal centerline and equally distant therefrom, and adjacent to the NPN bias current transistor and the PNP bias current transistor, respectively.

4. The high speed integrated circuit operational amplifier chip of claim 1 wherein the inverting input bonding pad and the non-inverting input bonding pad are symmetrically disposed about the thermal centerline and the $V_{CC}$ bonding pad and the $V_{EE}$ bonding pad are symmetrically disposed about the thermal centerline.

5. The high speed integrated circuit operational amplifier chip of claim 4 wherein the output bonding pad is symmetrically disposed on the thermal centerline.

6. A high speed integrated circuit operational amplifier chip including first, second, third and fourth edges and first, second, third and fourth corners, the operational amplifier chip comprising in combination:

(a) a plurality of bonding pads, including first, second, third and fourth bonding pads located in the first, second, third and fourth corners, respectively;

approximately equal size first and second half sections of the operational amplifier chip being located on opposite sides of a thermal centerline parallel to the second and fourth edges;

(b) an output driver circuit located adjacent to the third edge and disposed approximately symmetrically about the thermal centerline to provide approximately balanced differential heating of the operational amplifier chip relative to the thermal centerline, wherein the output driver circuit includes first and second parallel-connected NPN output transistor sections and first and second parallel-connected PNP output transistor sections, the first and second PNP output transistor sections being symmetrically disposed immediately adjacent to and on opposite sides of the thermal centerline, the first and second NPN output transistor sections being disposed symmetrically about the thermal centerline immediately adjacent to the first and second PNP output transistor sections, respectively, the first and second parallel-connected NPN output transistor sections and the first and second parallel-connected PNP output transistor sections being symmetrically aligned along a line perpendicular to the thermal centerline so as to both minimize the size of the chip and minimize thermal instability of the operational amplifier thereon;

(c) a low gain differential input circuit located in a left portion of the operational amplifier chip and disposed approximately symmetrically about the thermal centerline to provide approximately balanced responses of various matched transistors in the low gain differential input circuit to isotherms produced by the balanced differential heating; and (d) a plurality of transistors located adjacent to the low gain differential input circuit and disposed symmetrically along and on opposite sides of the thermal centerline to provide approximately balanced response of the plurality of transistors to the balanced differential heating.

* * * * *